(12) United States Patent
Khellah et al.

(10) Patent No.: US 6,724,648 B2
(45) Date of Patent: Apr. 20, 2004

(54) SRAM ARRAY WITH DYNAMIC VOLTAGE FOR REDUCING ACTIVE LEAKAGE POWER

(75) Inventors: Muhammad Khellah, Lake Oswego, OR (US); Vivek De, Beaverton, OR (US); Dinesh Somasekhar, Hillsboro, OR (US); Yibin Ye, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/117,163

(22) Filed: Apr. 5, 2002

(65) Prior Publication Data

US 2003/0189849 A1 Oct. 9, 2003

(51) Int. Cl.[7] .............................................. G11C 11/40
(52) U.S. Cl. ....................................... 365/154; 365/227
(58) Field of Search ................................ 365/154, 227, 365/189.11, 226

(56) References Cited

U.S. PATENT DOCUMENTS 5,297,098 A * 3/1994 Nakatani et al. ............ 365/226
5,303,190 A * 4/1994 Pelley, III ............... 365/189.11
5,644,546 A * 7/1997 Furumochi et al. ......... 365/226
5,668,770 A * 9/1997 Itoh et al. .................... 365/227
6,307,803 B1 * 10/2001 Chien .......................... 365/227

OTHER PUBLICATIONS

Koji Nii, et al., "A Low-Power SRAM using Auto-Back gate-Controlled (ABC) MT-CMOS", 1998 IEEE/ACM International Symposium on Low-Power and Electronics Design, Aug. 1998, Monterey CA pp. 293–298.

* cited by examiner

Primary Examiner—Tan T. Nguyen
(74) Attorney, Agent, or Firm—Fish & Richardson P.C.

(57) ABSTRACT

A power management device and static random access memory (SRAM) architecture with dynamic supply voltages reduce active power leakage in SRAM cells. When a cell is inactive, a low level supply voltage is applied to the source line connected to the cell to maintain the data stored in the cell. However, before a cell is accessed (e.g., during a read or write operation), the source line is raised to a high level supply voltage.

35 Claims, 8 Drawing Sheets

SRAM ARRAY WITH DYNAMIC VOLTAGE FOR REDUCING ACTIVE LEAKAGE POWER

TECHNICAL FIELD

This invention relates to static random access memories (SRAMs), and more particularly to reducing active leakage power in SRAMs.

BACKGROUND

An SRAM cell may be implemented using a bistable flipflop. The flipflop includes, for example, two load elements, two storage transistors, and two access transistors. A direct current (DC) supply voltage is applied to the flipflop to retain data stored by the flipflop. The flipflop may be implemented using metal oxide semiconductor (MOS) or bipolar transistors.

Figure 1:
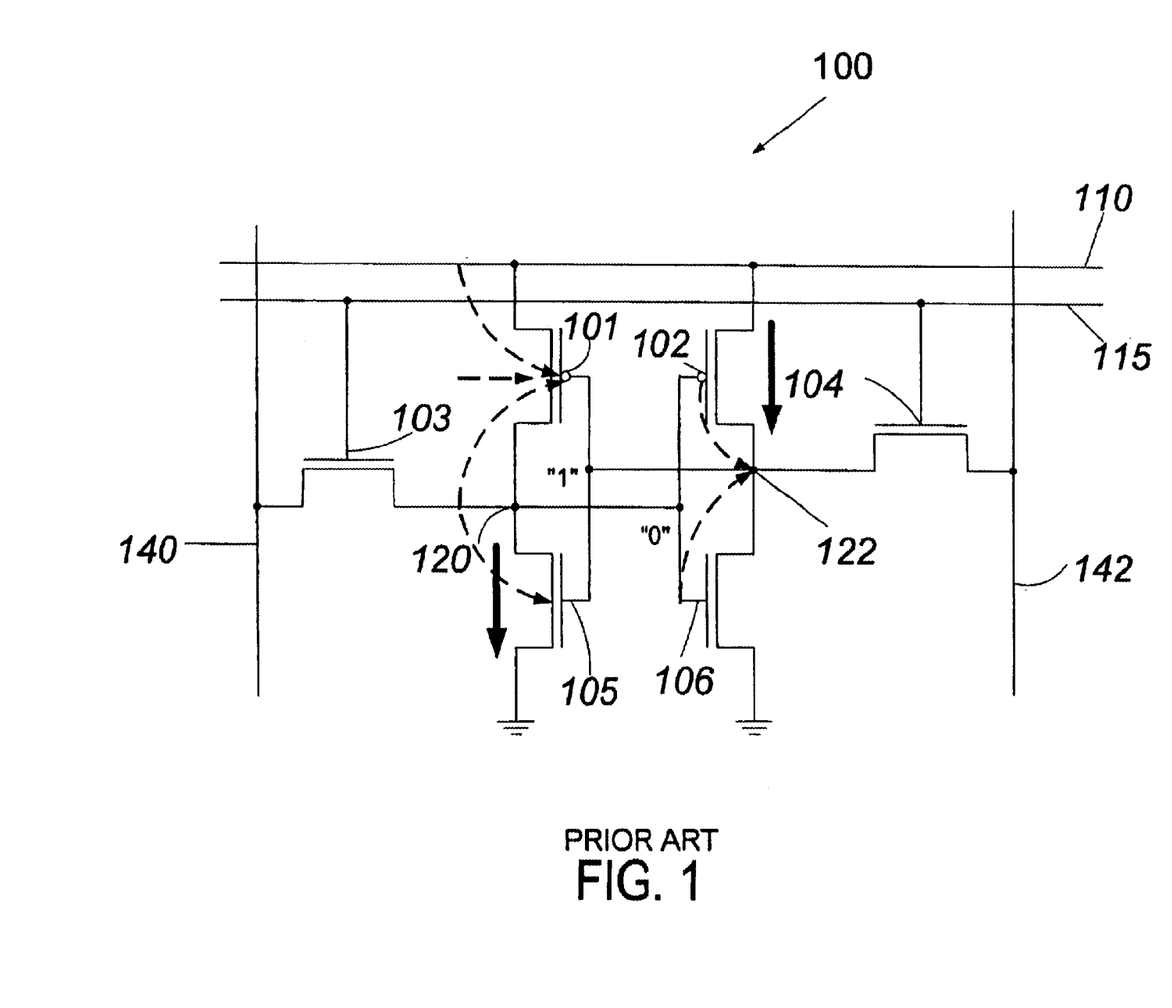
FIG. 1 is a circuit diagram of a conventional, full CMOS, six transistor SRAM cell.

As shown in FIG. 1, a conventional, full complementary MOS (CMOS) SRAM cell 100 includes six transistors. Pull-up transistors 101 and 102 may be implemented using, for example, p-channel MOS (PMOS) transistors. Access transistors 103 and 104 and storage transistors 105 and 106 may be implemented using, for example, n-channel MOS (NMOS) transistors.

The drains of the pull-up transistors 101 and 102 are connected to a source line 110. The source line 110 is connected to a DC supply voltage $V_{DD}$.

Nodes 120 and 122 store a potential that indicates a state of the cell 100. If the potential stored at node 120 is high, then the potential at node 122 is low. Conversely, if the potential at node 122 is high, then the potential at node 120 is low. The DC supply voltage $V_{DD}$ is applied to the sources of the pull up transistors 101 and 102 to retain the potentials stored at the nodes 120 and 122. The two stable states stored at the nodes 120 and 122 may be defined as a logic '1' and a logic '0.'

The gates of the access transistors 103 and 104 are connected to a word line 115. The drains of the access transistors 103 and 104 are connected to the bit lines 140 and 142, respectively. The sources of the access transistors 103 and 104 are connected to the nodes 120 and 122, respectively. A high potential on the write line 115 turns on transistors 103 and 104 to connect nodes 120 and 122 to the bit lines 140 and 142, so that the nodes 102 and 122 may be accessed.

One problem associated with SRAMs is active power leakage. If the cell 100 is in an active mode (i.e., the source line 110 of the cell 100 is maintained at the supply voltage $V_{DD}$), several leakage currents result. For example, if a cell 100 has a high potential stored at node 120 and a low potential at node 122, then gate oxide leakage currents occur, as shown by the dotted arrows in FIG. 1. In addition, sub-threshold leakage currents occur in transistors 102 and 105, as shown by the solid bold arrows in FIG. 1.

Individually, the active power leakage of one cell 100 is relatively small. However, an SRAM array may include millions of cells 100. Taken as a whole, the leakage currents of multiple cells may result in substantial active power leakage for the array. Although some gate oxide power leakage and sub-threshold power leakage may be tolerated in SRAMS, as the number of SRAM cells 100 in an array continues to increase, active power leakage is only compounded. In addition, with each new generation of SRAMs, the physical size of the cells 100 is reduced to enable more cells 100 to be placed in an array. As the size of the cells 100 is reduced, there is a corresponding reduction in the thickness of the gate oxide layer. As the gate oxide layer becomes thinner, active gate oxide power leakage increases further compounding the problem in SRAMs.

DESCRIPTION OF DRAWINGS

Like reference symbols in the various drawings indicate like elements.

DETAILED DESCRIPTION

As the number of cells 100 in an SRAM array increases, and the physical size of a cell 100 decreases, active power leakage dramatically increases. As explained above, active power leakage in SRAM cells 100 is primarily attributable to gate oxide leakage currents and sub-threshold leakage currents. Both types of leakage currents are sensitive to the supply voltage $V_{DD}$ that is applied to the memory array to retain data stored by the cells 100. Reducing the supply voltage $V_{DD}$ can reduce the active power leakage in a cell 100. However, merely reducing, the supply voltage $V_{DD}$ to reduce active power leakage has drawbacks.

One drawback of reducing the supply voltage $V_{DD}$ to control active power leakage is degraded memory performance. To ensure proper operation of the memory array, the memory array should be balanced. To balance the memory array, the supply voltage $V_{DD}$ applied to the source line 110 for each cell 100 should be substantially equal to the voltage applied to the bit lines 140 and 142 to access the cell 100 (e.g., during a read or a write operation).

If the supply voltage $V_{DD}$ is reduced, then the corresponding voltage used to pre-charge the bit lines 140 and 142 to access a cell should be reduced to maintain array balance. However, a lower voltage on the bit lines 140 and 142 impedes the sense amplifier's ability to determine the voltage differential between the bit lines 140 and 142. In addition, circuitry, such as, for example, a diode, must be added to the bit lines 140 and 142 to reduce the voltage on the bit lines 140 and 142. However, pre-charging a bit line (140 or 142) through a diode is slow (particularly at a low supply voltage $V_{DD}$). The lower charge on the bit lines 140 and 142 also is susceptible to noise coupling and current injection from adjacent devices and busses. Therefore, reducing the supply voltage $V_{DD}$ may produce slower read times and/or inaccurate reading of data.

Another drawback of operating at a reduced supply voltage $V_{DD}$ is diminished cell stability. If the supply voltage $V_{DD}$ is reduced, then the potential stored at node 120 or 122 also is reduced. As a result, the current drawn from the bit lines 140 or 142 during a read operation may cause the cell 100 to inadvertently toggle (in effect writing the opposite of the stored state to the cell 100). Therefore, a subsequent reading of the cell 100 would provide incorrect data.

During most of a cell's active operation, the cell 100 is connected to the supply voltage $V_{DD}$. However, when a cell 100 is not being accessed, the cell 100 is connected to the supply voltage $V_{DD}$ only to retain the data stored in the cell 100. As a result, active power leakage may be reduced by lowering the supply voltage $V_{DD}$ to a low-level supply voltage $LV_{DD}$ if a cell 100 is not being accessed. The drawbacks of operating at a lower supply voltage may be avoided by dynamically raising the low-level supply voltage $V_{DD}$ to a high-level supply voltage $HV_{DD}$ before the cell 100 is accessed. The high-level supply voltage $HV_{DD}$ may correspond to, for example, the voltage applied to the bit lines 140 and 142. A power management device may be used to dynamically control the application of the supply voltages ($HV_{DD}$ and $LV_{DD}$) to the cell 100 to reduce active power leakage and to maintain memory performance.

Figure 2:
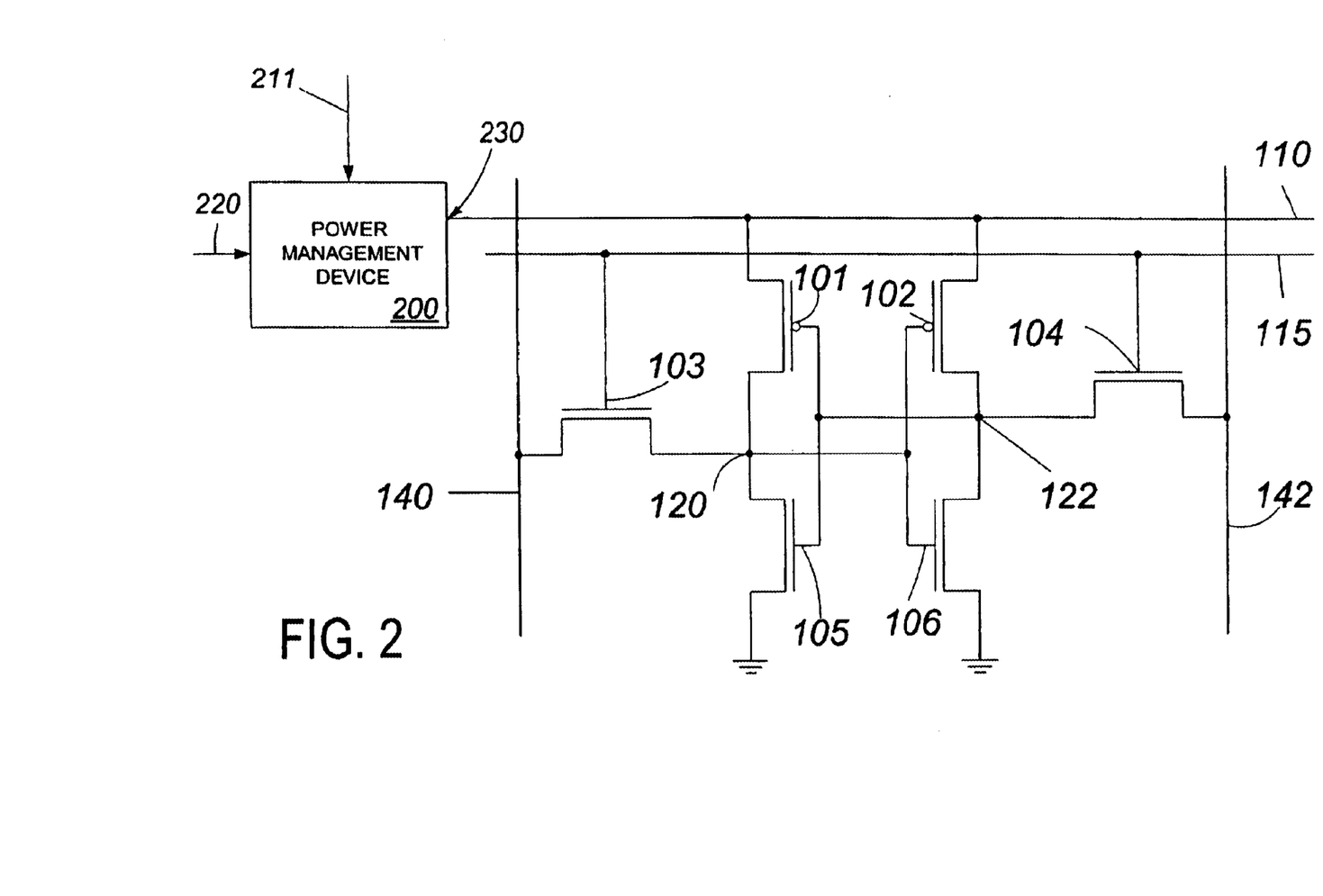
FIG. 2 is an exemplary block diagram of a power management system.

As shown in FIG. 2, an exemplary power management device 200 may be used to reduce active power leakage in one or more SRAM cells 100 that form a row in a memory array. The memory array may be configured to be access by a processing device, such as, for example, a microprocessor or a microcontroller. A power management device 200 may be connected to each source line 110 of the cell 100. The power management device 200 applies one of two voltages to the source line 110 to reduce active power leakage in the cells 100 of an array, and to maintain memory performance.

The power management device 200 includes a high-level supply voltage $HV_{DD}$ input 211. The high-level supply voltage $HV_{DD}$ may correspond, for example, to a conventional supply voltage $V_{DD}$ applied to a memory array (e.g., to retain the data stored in a cell or to pre-charge a bit line). An input 220 indicates whether a row connected to the power management device 200 is active (i.e., if a cell 100 in the row is to be accessed for a read or a write operation) or is inactive (i.e., no cells 100 in the row are to be accessed). An output 230 is connected to the source line 110 of a row of cells 100 to output a supply voltage ($HV_{DD}$ or $LV_{DD}$).

If the input 220 indicates that a row is active, then the power management device 200 applies the high-level supply voltage $HV_{DD}$ to the source line 110. If the input 220 indicates that a row is inactive, then the power management device 200 reduces the input supply voltage $HV_{DD}$ to a low-level voltage $LV_{DD}$. The low-level supply voltage $LV_{DD}$ is then applied to the source line 110. The low-level voltage $LV_{DD}$ may be lower than $HV_{DD}$, but high enough to retain the data stored at nodes 120 and 122 of cell 100.

Figure 3:
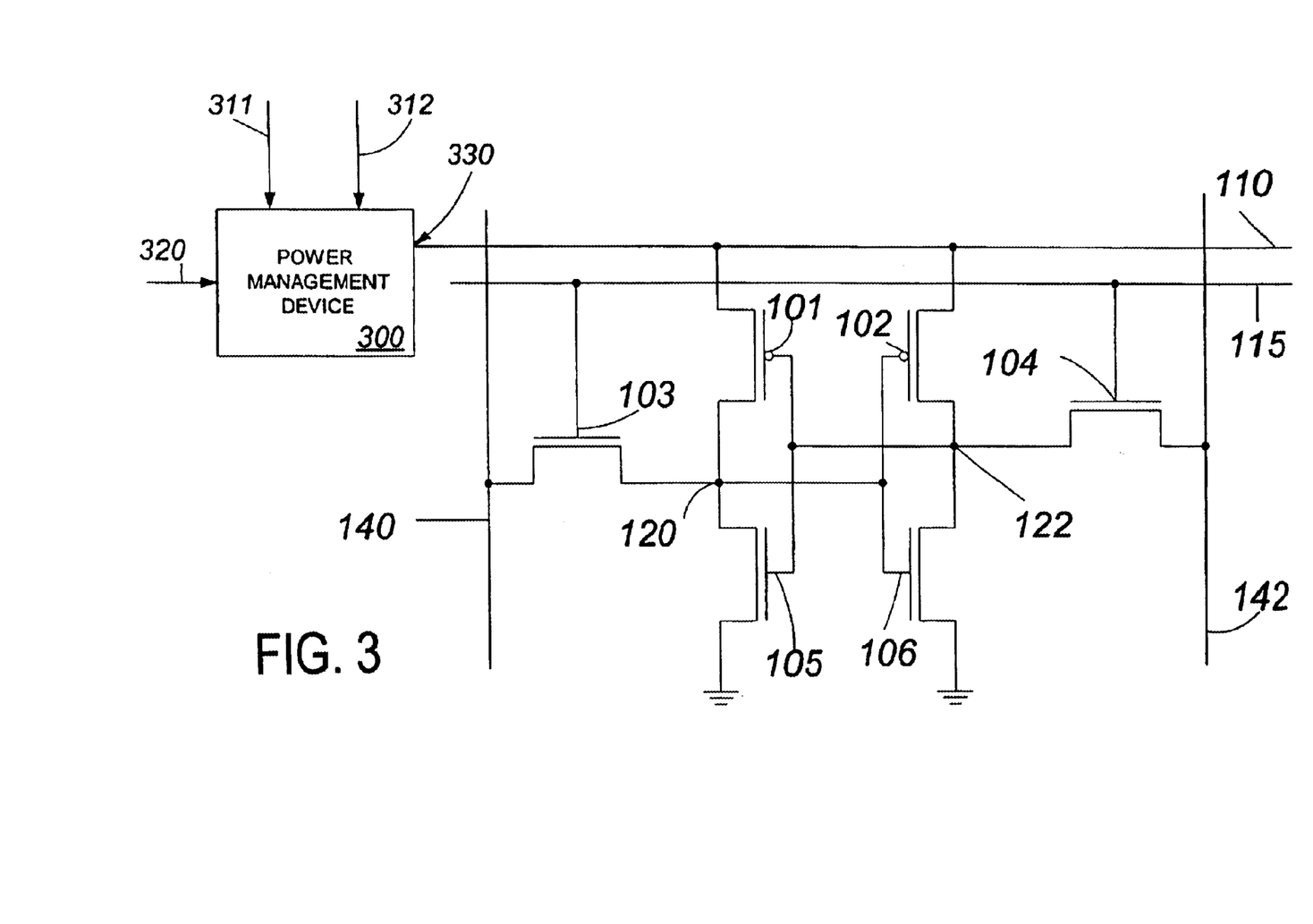
FIG. 3 is an exemplary block diagram of a power management system.

Another exemplary power management device 300 is shown in FIG. 3. The power management device 300 may be connected to the source line 110 of one or more cells 100 that form a row in a memory array. The power management device 300 applies one of two voltages to the source line 110 to reduce active power leakage in the cells 100 of an array, and to maintain memory performance.

The power management device 300 may include two inputs 311 and 312 that are connected to two different supply voltages. Input line 311 may be connected to a high-level supply voltage $HV_{DD}$, and input line 312 may be connected to a low-level supply voltage $LV_{DD}$. An input 320 indicates whether a row connected to the power management device 300 is active or inactive. An output 330 is connected to the source line 110 of a row of cells 100 to output the high-level voltage $HV_{DD}$ or low-level voltage $LV_{DD}$.

If the input 320 indicates that a row is inactive, then the power management device 300 applies the low-level supply voltage $LV_{DD}$ to the source line 110. If the input 320 indicates that the row is active, then the power management device 300 applies the high-level voltage $HV_{DD}$ to the source line 110.

Figure 4A:
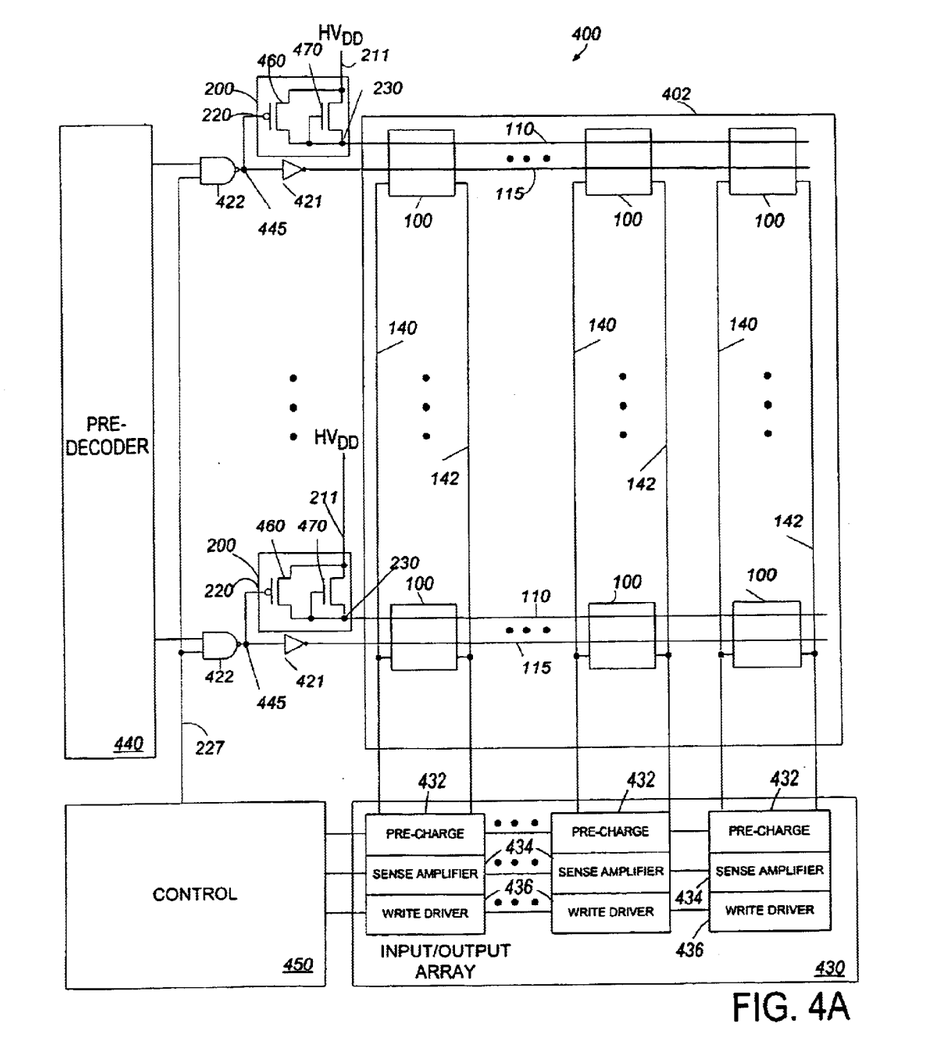
FIGS. 4A–4C are exemplary block diagrams of memory arrays including power management devices.

As shown in FIG. 4A, an SRAM architecture with reduced active power leakage 400 includes a number of cells 100 arranged in rows and columns. The rows and columns form a memory array 402. Each cell 100 in the array 402 is connected to a word line 115 and a pair of bit lines 140 and 142. All cells 100 connected to a common word line 115 form a row, and all cells 100 connected to a common pair of bit lines 140 and 142 form a column. The source lines 110 of each row are connected to a power management device 200.

Each word line 115 is connected to a word line driver 421, such as, for example, an inverting diode. Each driver 421 is connected in series with an associated not-and gate (NAND) 422. Each NAND gate 422 also is connected to a row enable line 425 and a word-line enable line 427.

The bit lines 140 and 142 of each column are connected to an Input/Output (I/O) array 430. Each pair of bit lines 140 and 142 is connected to a pre-charge circuit 432, a sense amplifier 434, and a write driver 436 in the I/O array 430; however, a sense-amplifier and write driver may be shared among a number of bit line pairs, for example, to reduce area and power consumption.

To access a cell 100, the cell's address is decoded by a pre-decoder 440 to determine the addressed cell's row. After decoding the address, the pre-decoder 440 generates a high potential on the row enable line 425 to select the word line 115 connected to the addressed cell 100. In addition, a control circuit 450 generates a high potential on the word enable line 427. As a result, both inputs to the NAND gate 422 of the row that contains the addressed cell 100 are high, which produces a low potential at node 445. The low potential at node 445 causes the inverter 421 to drive the word line 115 to a high potential. The high potential on the word line 115 connects the addressed cell 100 to the bit lines 140 and 142, so that the cell 100 may be accessed. All other rows in the array 402 are unselected and have a low potential on their word lines 115.

Before a row is selected, the control circuit 450 determines the pair of bit lines 140 and 142 that correspond to the column that contains the addressed cell 100. The control circuit 450 then instructs the pre-charge device 432 to pre-charge the pair of bit lines 140 and 142 to the supply voltage $VD_{DD}$.

During a read operation, the pre-charge device 432 is turned off and the charged bit lines 140 and 142 are connected to the addressed cell 100. After the bit lines 140 and 142 are connected, the low potential at either node 120 or 122 causes a dip in the voltage on the corresponding charged bit line 140 or 142. The sense amplifier 434 detects the dip in voltage on the corresponding bit line 140 or 142, and determines the state associated with the cell 100 (i.e., a logic '1' or '0') based on the detected voltage differential between the bit lines 140 and 142.

During a write operation, after the bit lines 140 and 142 are pre-charged, the write driver 436 grounds one of bit lines 140 or 142. At the same time, the word line 115 connected to the addressed cell 100 is driven to high potential to connect the bit lines 140 and 142 to the cell 100. The combination of voltages on the bit lines 140 and 142 forces the cell 100 to toggle to the desired state that is to be written in the cell 100.

The output 430 of a power management device 200 may be connected to each source line 110. In addition, the input 220 of the power management device 200 may be connected to node 445. The power management devices 200 may include, for example, a power management circuit including two transistors 460 and 470. Transistor 460 may be implemented using, for example, a PMOS transistor. Transistor 470 may be implemented using, for example, an NMOS transistor. The drains of transistors 460 and 470 may be connected to the high-level supply voltage $HV_{DD}$. The gate of transistor 460 may be connected to node 445 (through input 220), and the source of transistor 460 may be connected to the source line 110. Transistor 470 may be configured as a diode by tying the gate and source to the source line 110. The source line 110 is connected to each cell 100 in a row of the memory array 402.

During most of an SRAM's operation, all rows but one are inactive. If a row is inactive, then the pre-decoder 440 outputs a low potential on the row enable line 425 for each corresponding inactive row. As a result, the output from NAND gate 422 for an inactive row causes a high potential at the input 220 of the power management device 200, which turns off transistor 460. Transistor 470, which is configured as a diode, then clamps the source line 110 to a voltage lower than $HV_{DD}$ (i.e., $LV_{DD}$) and maintains the source line 110 at the low-level voltage $LV_{DD}$.

If a row is activated, then the pre-decoder 440 determines the address associated with a cell 100 and generates a high potential on the corresponding row enable line 425. In addition, the controller 450 generates a high potential on the word-line enable line 427. As a result, the high potential applied to both inputs of the NAND gate 423 generates a low potential at node 445.

The low potential at the input of driver 421 brings the write line 115 to a high potential. The low potential at node 445 also is applied to the gate of transistor 460 through input 220. Transistor 460 then turns on to connect the source line 110 to the supply voltage $HV_{DD}$ through output 230. As a result, the voltage on source line 110 is dynamically raised from $LV_{DD}$ to $HV_{DD}$ before any cell in the row is accessed (e.g., during a read or a write operation).

Figure 4B:
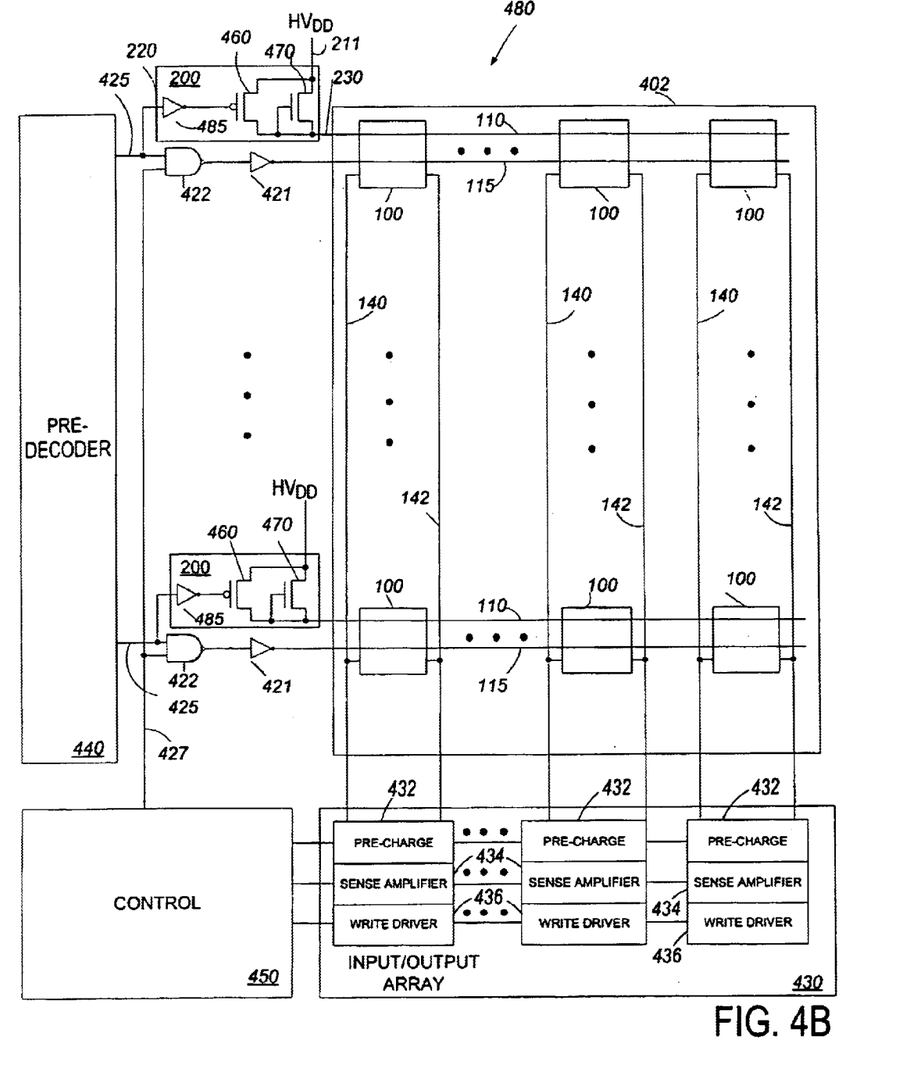

As shown in FIG. 4B, another SRAM architecture 480 with reduced active power leakage includes power management devices 200 and a memory array 402. The power management devices 200 may include, for example, a power management circuit. The power management circuit may include, for example, transistors 460 and 470. An inverter 485 may be connected between the input 320 and the gate of transistor 460. The input 220 of the power management device 200 is connected to the row enable line 425.

If a row is active, then the high potential on the row enable line 425 applied to input 220 drives the inverter 485 to generate a low potential at the gate of transistor 460. Transistor 460 then turns on and raises the voltage on the source line 110 from the low-level voltage $LV_{DD}$ to a high-level voltage $HV_{DD}$. If a row is inactive, the low potential on the row enable line 425 applied to input 220 turns off transistor 460. The voltage on the source line 110 decreases until the source line 110 is clamped to the low-level supply voltage $LV_{DD}$ by transistor 470.

Figure 4C:
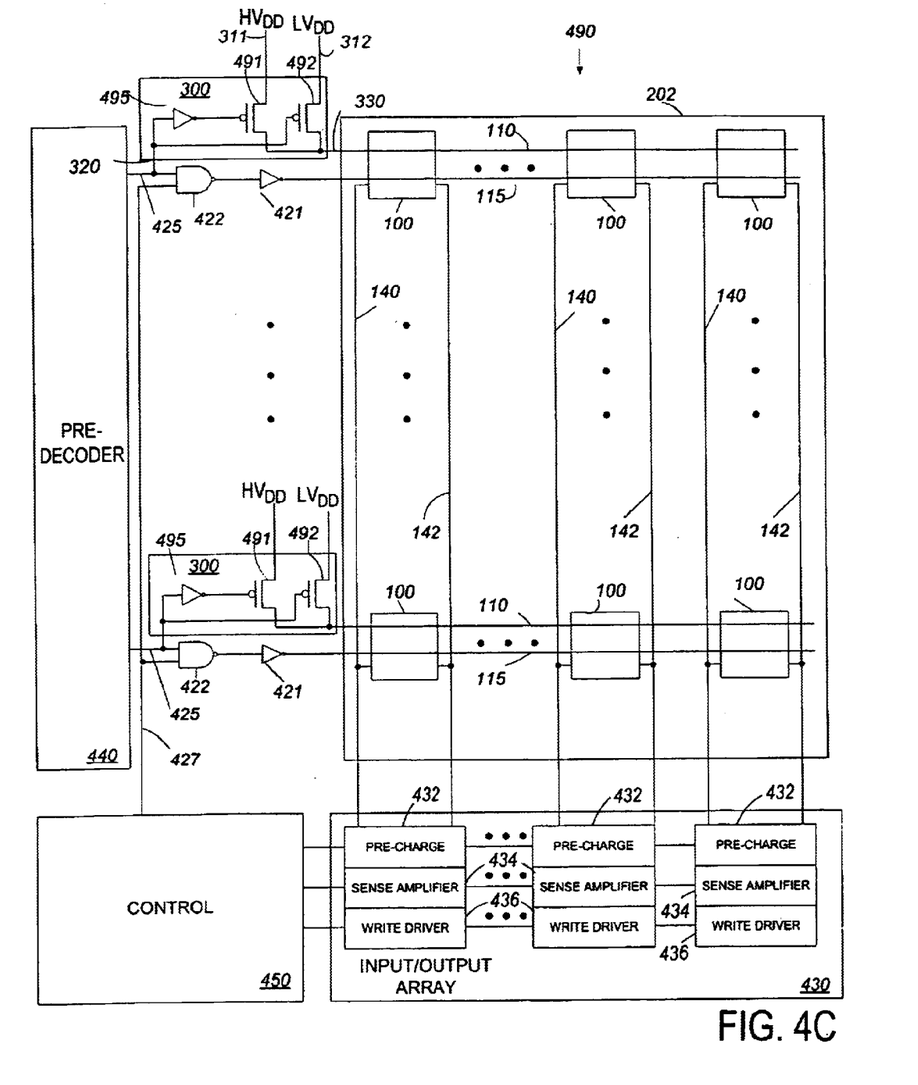

As shown in FIG. 4C, another SRAM architecture 490 with reduced active power leakage includes power management devices 300 and a memory array 402. The power management device 300 may include a power management circuit. The power management circuit may include, for example, two PMOS transistors 491 and 492. As shown in FIG. 4C, the drain of transistor 491 may be connected to the high-level supply voltage $HV_{DD}$ input 311, and the drain of transistor 492 may be connected to low-level supply voltage $LV_{DD}$ input 312. The gate of transistor 491 may be connected to an inverting diode 495. The gate of transistor 492 may be connected to the input 320. The inverter diode 495 may be connected to the input 320 of the power management device 300. The output of the power management device 300 may be connected to the source line 110.

If a row is active, then the high potential on the row enable line 425 applied to the input 320 turns off transistor 492. In addition, the high potential at the inverting diode 495 generates a low potential at the gate of transistor 491. As a result, transistor 491 turns on, and the high-level supply voltage $HV_{DD}$ is applied to the source line 110 through output 430.

If a row is inactive, the potential from the row enable line 425 to the input 320 of the power management device 300 is low. The low potential input to the inverter 495 generates a high potential at the gate of transistor 491. Transistor 491 then turns off and disconnects the high-level supply voltage $HV_{DD}$ from the source line 110. However, the low potential at the gate of transistor 492 turns on transistor 492 to apply the low-level supply voltage $LV_{DD}$ to the source line 110.

Figure 5:
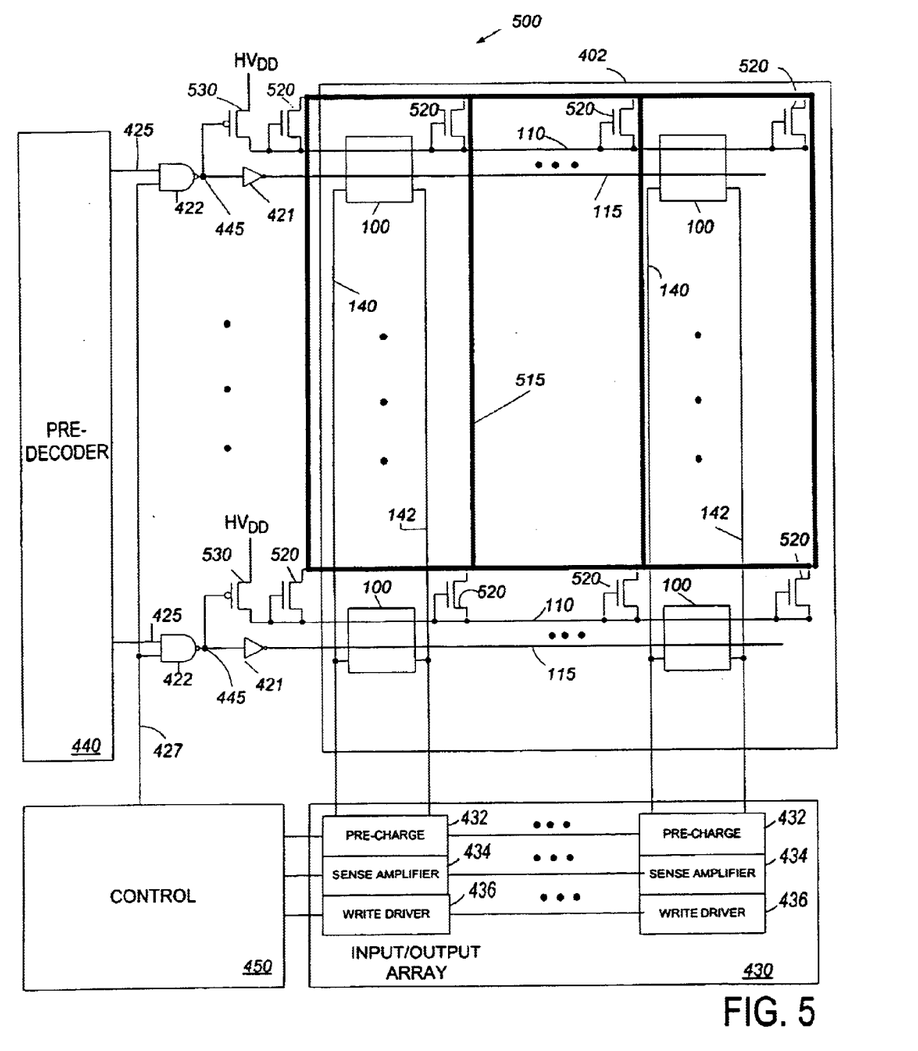
FIG. 5 is an exemplary block diagram of memory array with reduced active power leakage.

FIG. 5 shows another exemplary SRAM architecture 500 with reduced active power leakage. The architecture 500 includes a number of cells 100 connected to a supply voltage power grid 515. A number of power control devices 520 are dispersed throughout the power grid 515. The power control devices 520 may be implemented using, for example, NMOS transistors. The drains of the NMOS transistors may be connected to a high-level power supply $HV_{DD}$ supplied by the power grid 515. The gates and sources of the NMOS transistors may be connected to the source line 110. According to other implementations, one power control device 520 may be used a number of cells 100 (e.g., one power control device 520 could be used for every 2/4/8/16/32/etc. cells 100).

A power switch 530 may be connected to each row. The power switch 530 may be implemented using, for example, a PMOS transistor. The gate of the PMOS transistor may be connected to node 445. The source of the PMOS transistor may be connected to a high-level supply voltage supply $HV_{DD}$. The drain of the PMOS transistor may be connected to the source line 110.

If a row is inactive, the resulting high potential at node 445 turns off power switch 530. However, the power control devices 520 on the inactive rows clamp the corresponding source lines 110 to the low-level supply voltage $LV_{DD}$. If a row is activated, then a low potential generated at node 445 turns on the power switch 630 to connect the source line 110 to the high-level supply voltage $HV_{DD}$. Therefore, the voltage applied to the source line 110 is dynamically raised to the high-level voltage $HV_{DD}$ before a cell is accessed (e.g., during a read or a write operation).

Figure 6:
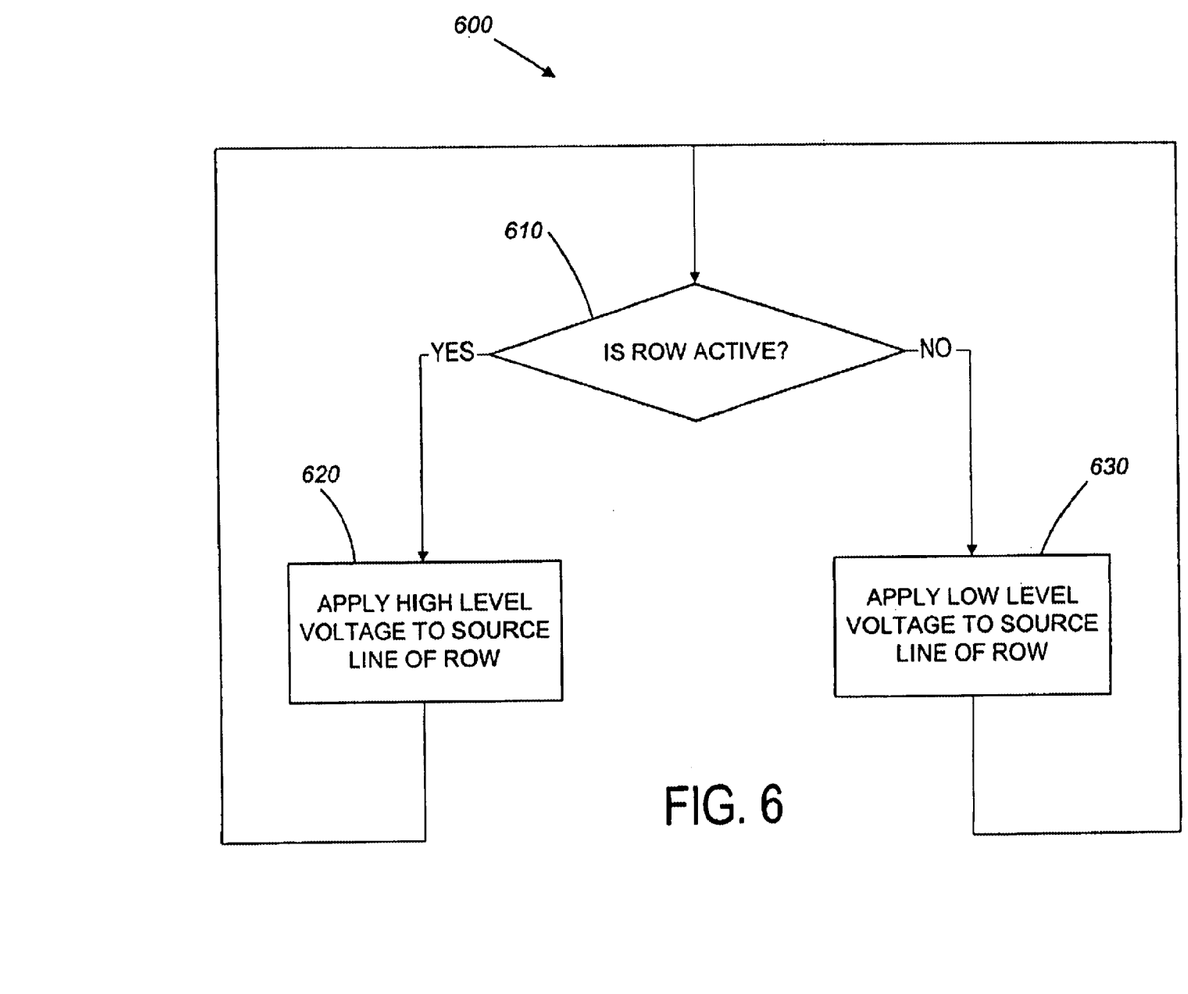
FIG. 6 is an exemplary flow chart of a process for reducing active power leakage.

FIG. 6 shows a process 600 for reducing active power leakage in a memory array. First, it is determined if a row is active or inactive (610). If the row is active, then the source line of the row in a memory array is connected to a high-level supply voltage $HV_{DD}$ (620). If the row is determined to be inactive, then a low-level voltage is applied to the source line of the row (630).

The power management devices (e.g., 200 and 300) and SRAM architectures (e.g., 400, 480, 490, and 500) reduce active power leakage by dynamically varying the voltage of a source line 110 based on the activity of the cells 100 attached to the source line 110. Both the gate oxide and the substrate leakage currents are sensitive to the supply voltage applied to the source lines 110 of a memory array 402. In particular, the gate oxide leakage currents are exponentially related to the voltage applied to the power source line 110. A significant reduction in active power leakage may be achieved by applying the low-level voltage $LV_{DD}$ to the source lines 110 when the cells 110 of a row are inactive. However, the power management devices (e.g., 200 and 300) and SRAM architectures (e.g., 400, 480, 490, and 500) avoid the drawbacks of, for example, operating at a low-level voltage, by raising the voltage applied to the source line 110 to a high-level supply voltage $HV_{DD}$ before a cell 100 is accessed. As a result, the overall active power leakage is significantly reduced, and the cells may be accessed without any additional circuitry on the bit lines, any significant delay to access or read data from the cells, any imbalance to the array or any additional corruption of the data.

A number of exemplary implementations have been described. Nevertheless, it will be understood that various modifications may be made. For example, advantageous results still may be achieved if the steps of the disclosed techniques are performed in a different order and/or if components in a disclosed architecture, device, or circuit are combined in a different manner and/or replaced or supplemented by other components. Accordingly, other implementations are within the scope of the following claims.

What is claimed is:

1. A device comprising:
   a first input configured to receive an indication that a row of a memory array is active or inactive;
   a second input configured to receive a first voltage;
   an output configured to apply the first voltage or a second voltage to a source line of the memory array; and
   a power management circuit connected to receive the first and second inputs and configured to apply the second voltage to the output if the row is inactive to reduce active power leakage in the row connected to the source line, wherein the second voltage is lower than the first voltage.

2. The device of claim 1 wherein the power management circuit is configured to apply the first voltage to the output if the first input indicates that the row is active.

3. The device of claim 1 wherein the power management circuit comprises a first transistor configured to apply the first voltage to the output if the row is active and a second transistor configured to apply the second voltage to the output if the row is inactive.

4. The device of claim 1 further comprising a third input connected to the power management circuit and configured to receive the second voltage.

5. The device of claim 4 wherein the power management circuit is configured to apply the first voltage to the output if the first input indicates that the row is active.

6. The device of claim 4 wherein the power management circuit comprises a first transistor configured to connect the second input to the output if the row is active and a second transistor configured to connect the third input to the output if the row is inactive.

7. A static random access memory (SRAM) comprising:
   one or more cells;
   a source line connected to the cells configured to supply power to the cells; and
   a power management device connected to the source line and configured to apply a first voltage to the source line if one of the cells is to be accessed and to apply a second voltage to the source line if none of the cells is to be accessed, wherein the second voltage is less than the first voltage and use of the second voltage reduces active power leakage in the cells.

8. The array of claim 7 wherein the power management device is configured to reduce active power leakage in the cells by applying the second voltage to the source line.

9. The array of claim 7 wherein the power management circuit comprises a first transistor configured to apply the first voltage to the source line and a second transistor configured to apply the second voltage to the source line.

10. The array of claim 7 wherein the power management circuit comprises:
    a first input configured to receive an indication that one of the cells is to be accessed;
    a second input configured to receive the first voltage;
    an output configured to apply the first voltage or the second voltage to the source line; and
    a power management circuit configured to apply the second voltage to the output if the first input indicates that none of the cells is to be accessed.

11. The array of claim 10 wherein the power management circuit is configured to apply the first voltage to the output if the first input indicates that one of the cells is to be accessed.

12. The array of claim 11 further comprising a third input configured to receive the second voltage.

13. The array of claim 12 wherein the power management circuit is configured to apply the first voltage to the output if the first input indicates that one of the cells is to be accessed.

14. The array of claim 12 wherein the power management circuit comprises a first transistor configured to apply the first voltage to the output if the first input indicates that one of the cells is to be accessed and a second transistor configured to apply the second voltage to the output if the first input indicates that none of the cells is to be accessed.

15. The array of claim 10 wherein the power management circuit comprises a first transistor configured to apply the first voltage to the output if the first input indicates that one of the cells is to be accessed and a second transistor configured to apply the second voltage to the output if the first input indicates that none of the cells is to be accessed.

16. A random access memory (RAM) comprising:
    a row of cells;
    a power grid configured to supply a first voltage;
    a source line connected to the row of cells and configured to supply power to the row of cells;
    a power switch connected to the source line and configured to apply a first voltage to the source line if the row is active; and
    one or more power control devices connected between the power grid and the source line and configured to supply a second voltage that is lower than the first voltage to the source line if the row is inactive.

17. The RAM of claim 16 wherein the power switch includes a transistor connected between the power source supplying the first voltage and the source line.

18. The RAM of claim 16 wherein the power control device is a transistor.

19. The RAM of claim 16 wherein two or more power control devices are connected to each source line.

20. The RAM of claim 16, wherein two power control devices are connected between the power grid and a corresponding source line for each cell in a row.

21. A method for managing active power leakage in a memory array, the method comprising:

determining if a row in the memory array is active; and applying a first voltage to a source line connected to the row if the row is determined to be active;

applying a second voltage to the source line if the row is determined to be inactive, wherein the first voltage is greater than the second voltage.

22. The method of claim 21 further comprising reducing the active leakage current of cells in the row when applying the second voltage to the source line.

23. A system comprising:

a processor;

a memory array configured to be accessed by the processor; and a device to manage active power leakage in the memory array, the device including a first input configured to receive an indication that a row of the memory array is active or inactive;

a second input configured to receive a first voltage;

an output configured to apply the first voltage or a second voltage to a source line of the memory array; and a power management circuit connected to receive the first and second inputs and configured to apply the second voltage to the output if the row is inactive to reduce active power leakage in the row connected to the source line, wherein the second voltage is lower than the first voltage.

24. The system of claim 23 wherein the power management circuit is configured to apply the first voltage to the output if the first input indicates that the row is active.

25. The device of claim 23 wherein the power management circuit comprises a first transistor configured to apply the first voltage to the output if the row is inactive and a second transistor configured to apply the second voltage to the output if the row is inactive.

26. The system of claim 23 further comprising a third input connected to the power management circuit and configured to receive the second voltage.

27. The system of claim 26 wherein the power management circuit is configured to apply the first voltage to the output if the first input indicates that the row is active.

28. The system of claim 26 wherein the power management circuit comprises a first transistor configured to connect the second input to the output if the row is active and a second transistor configured to connect the third input to the output if the row is inactive.

29. A device comprising:

a first input configured to receive an indication that a row of a memory array is active or inactive;

a second input configured to receive a first voltage;

an output configured to apply the first voltage or a second voltage to a source line of the memory array; and a power management circuit connected to receive the first and second inputs and configured to apply the second voltage to the output if the row is inactive to reduce active power leakage in the row connected to the source line, wherein the second voltage is lower than the first voltage;

wherein the power management circuit comprises a first transistor configured to apply the first voltage to the output if the row is active and a second transistor configured to apply the second voltage to the output if the row is inactive.

30. A device comprising:

a first input configured to receive an indication that a row of a memory array is active or inactive;

a second input configured to receive a first voltage;

an output configured to apply the first voltage or a second voltage to a source line of the memory array;

a power management circuit connected to receive the first and second inputs and configured to apply the second voltage to the output if the row is inactive to reduce active power leakage in the row connected to the source line, wherein the second voltage is lower than the first voltage; and a third input connected to the power management circuit and configured to receive the second voltage;

wherein the power management circuit comprises a first transistor configured to connect the second input to the output if the row is active and a second transistor configured to connect the third input to the output if the row is inactive.

31. A static random access memory (SRAM) comprising:

one or more cells;

a source line connected to the cells configured to supply power to the cells; and a power management device connected to the source line and configured to apply a first voltage to the source line if one of the cells is to be accessed and to apply a second voltage to the source line if none of the cells is to be accessed, wherein the second voltage is less than the first voltage and use of the second voltage reduces active power leakage in the cells;

wherein the power management circuit comprises a first transistor configured to apply the first voltage to the source line and a second transistor configured to apply the second voltage to the source line.

32. A static random access memory (SRAM) comprising:

one or more cells;

a source line connected to the cells configured to supply power to the cells; and a power management device connected to the source line and configured to apply a first voltage to the source line if one of the cells is to be accessed and to apply a second voltage to the source line if none of the cells is to be accessed, wherein the second voltage is less than the first voltage and use of the second voltage reduces active power leakage in the cells, wherein the power management circuit comprises:

a first input configured to receive an indication that one of the cells is to be accessed;

a second input configured to receive the first voltage;

an output configured to apply the first voltage or the second voltage to the source line;

a first transistor configured to apply the first voltage to the output if the first input indicates that one of the cells is to be accessed; and a second transistor configured to apply the second voltage to the output if the first input indicates that none of the cells is to be accessed.

33. A static random access memory (SRAM) comprising:

one or more cells;

a source line connected to the cells configured to supply power to the cells; and a power management device connected to the source line and configured to apply a first voltage to the source line if one of the cells is to be accessed and to apply a second voltage to the source line if none of the cells is to be accessed, wherein the second voltage is less than the first voltage and use of the second voltage reduces active power leakage in the cells, wherein the power management circuit comprises:

a first input configured to receive an indication that one of the cells is to be accessed;

a second input configured to receive the first voltage;

a third input configured to receive the second voltage;

an output configured to apply the first voltage or the second voltage to the source line;

a first transistor configured to apply the first voltage to the output if the first input indicates that one of the cells is to be accessed; and a second transistor configured to apply the second voltage to the output if the first input indicates that none of the cells is to be accessed.

34. A system comprising:

a processor;

a memory array configured to be accessed by the processor; and a device to manage active power leakage in the memory array, the device including a first input configured to receive an indication that a row of the memory array is active or inactive;

a second input configured to receive a first voltage; an output configured to apply the first voltage or a second voltage to a source line of the memory array; and a power management circuit connected to receive the first and second inputs and configured to apply the second voltage to the output if the row is inactive to reduce active power leakage in the row connected to the source line, wherein the second voltage is lower than the first voltage, wherein the power management circuit comprises:

a first transistor configured to apply the first voltage to the output if the row is inactive; and a second transistor configured to apply the second voltage to the output if the row is inactive.

35. A system comprising:

a processor;

a memory array configured to be accessed by the processor; and a device to manage active power leakage in the memory array, the device including a first input configured to receive an indication that a row of the memory array is active or inactive;

a second input configured to receive a first voltage;

an output configured to apply the first voltage or a second voltage to a source line of the memory array;

a power management circuit connected to receive the first and second inputs and configured to apply the second voltage to the output if the row is inactive to reduce active power leakage in the row connected to the source line, wherein the second voltage is lower than the first voltage; and a third input connected to the power management circuit and configured to receive the second voltage;

wherein the power management circuit comprises a first transistor configured to connect the second input to the output if the row is active and a second transistor configured to connect the third input to the output if the row is inactive.

* * * * *